(12) United States Patent
Abe

(10) Patent No.: US 6,246,081 B1
(45) Date of Patent: Jun. 12, 2001

(54) SOLID-STATE IMAGING SENSOR, MANUFACTURING METHOD THEREOF AND IMAGING DEVICE

(75) Inventor: Hideshi Abe, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/113,171

(22) Filed: Jul. 10, 1998

(30) Foreign Application Priority Data

Jul. 11, 1997 (JP) .................................... 9-186136
Sep. 16, 1997 (JP) .................................... 9-250170

(51) Int. Cl.⁷ ...................... H01L 31/062; H01L 31/113; H01L 31/0232
(52) U.S. Cl. .......................... 257/294; 257/432; 257/435; 257/436; 438/69
(58) Field of Search .................................. 257/294, 414, 257/431–436; 438/69

(56) References Cited

U.S. PATENT DOCUMENTS 5,804,827 * 9/1998 Akagawa et al. ................ 250/370.06
5,925,898 * 7/1999 Spath ..................................... 257/98

* cited by examiner

Primary Examiner—Eddie C. Lee
Assistant Examiner—Allan R. Wilson
(74) Attorney, Agent, or Firm—Sonnenschein, Nath & Rosenthal

(57) ABSTRACT

A solid-state imaging sensor, a method for manufacturing the solid-state imaging sensor and an imaging device of which said solid state image sensor is designed to reduce unwanted light reflections, improve light focusing of light reflections from the substrate and oblique light constituents onto the sensor in order to allow further reduction in pixel size. Transfer electrodes in a line shape are arrayed at spaced intervals on a substrate, discrete sensors for photo-electric conversion are formed between the transfer electrode lines, a light-impervious film consisting of a first and second light-impervious films with an aperture positioned directly above a sensor is formed on the substrate and covers the transfer electrode to block any incident light other than the beam of light R from entering the sensor, and an on-chip lens for focusing the light R onto a sensor is formed above the light-impervious film. The light-impervious film has a lower overhang formed on the bottom edge of the side surface of the first light-impervious film, an upper overhang formed on the top edge of the side surface of the second light-impervious film, and the focus point P of the on-chip lens designed to be at a position with a height equal to the tip of the upper overhang directly above the sensor.

7 Claims, 7 Drawing Sheets

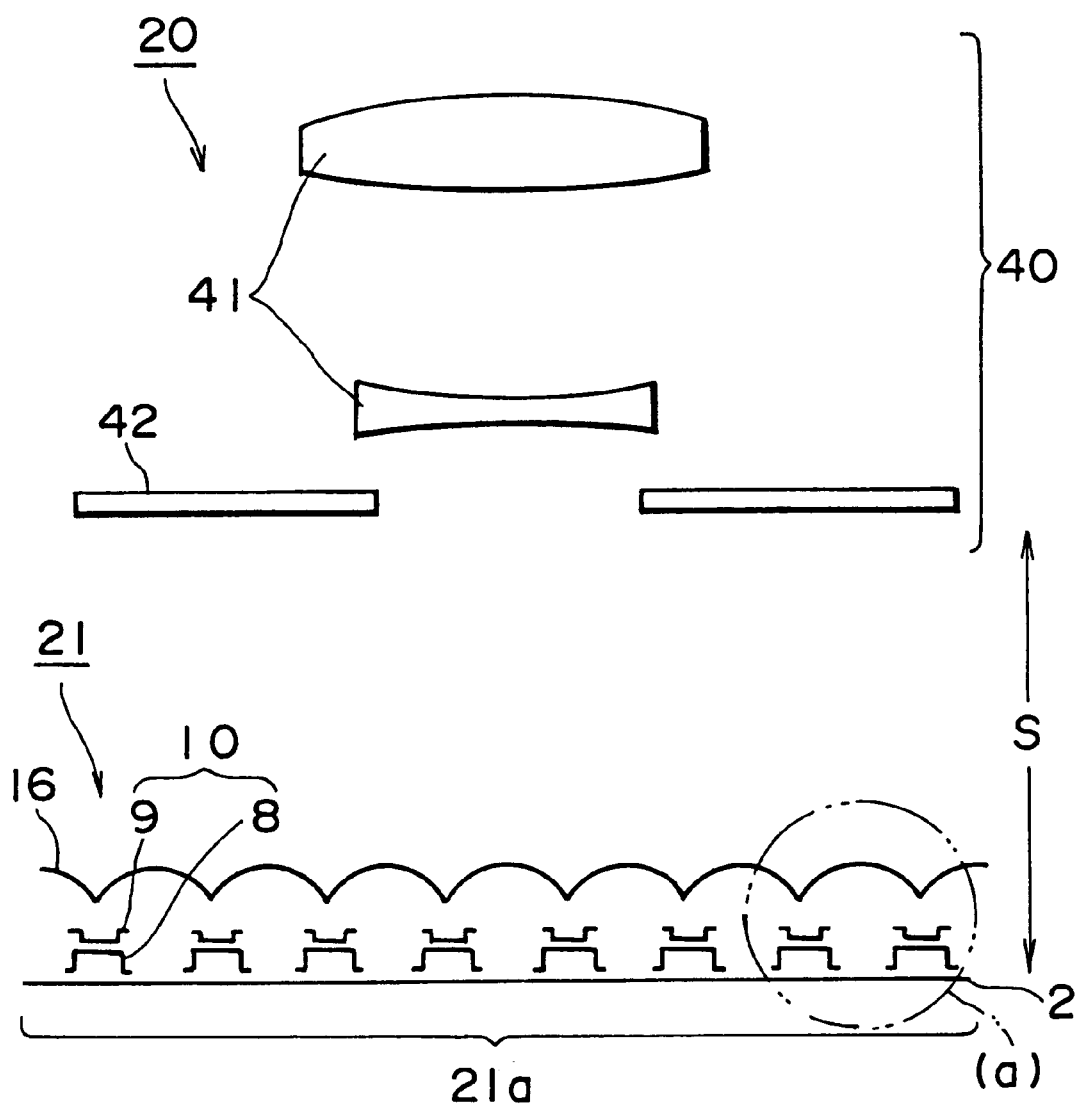

SOLID-STATE IMAGING SENSOR, MANUFACTURING METHOD THEREOF AND IMAGING DEVICE

BACKGROUND OF THE INVENTION

1. Field of the Invention

The present invention relates in general to a solid state imaging sensor, a method for manufacturing the solid-state imaging sensor and an imaging device, and relates in particular to a CCD type solid-state imaging sensor (hereafter CCD solid-state image sensor), a manufacturing method for the CCD solid-state image sensor, and an imaging device incorporating the CCD solid-state image sensor.

2. Description of Related Art

The pixel structure for the CCD solid-state image sensor known in the conventional art is for example shown in the cross section of an essential portion in FIG. 9. A line-shaped vertical transfer section 32 is formed at intervals on a silicon (Si) substrate 31. A line-shaped transfer electrode 33 is formed on the silicon substrate 31 directly above the vertical transfer section 32. Further, a discrete sensor 34 for performing photoelectric conversion is formed on the silicon (Si) substrate 31 between the lines of the transfer electrode 33.

A light-impervious film 35 with an aperture is formed directly above the sensor 34 and covers the transfer electrode 33 from above. Light enters the sensor 34 through the aperture 36 of the light-impervious film 35. This light-impervious film 35 functions to block light from entering any portion other than the sensor 34. Further, incident light is focused on the sensor 34 by a so-called on-chip lens (OCL) 37.

In this kind of CCD solid-state image sensor 30, light enters from the edge of the aperture 36 of the light-impervious film 35 so that light may reflect at the boundary between the light-impervious film 35 and the silicon substrate 31 and a portion of the reflected light may enter the vertical transfer section 32 causing a problem known as "smear". An overhang 35a is installed to project over the bottom of said light-impervious film 35 and over the sensor 34 in order to reduce this smear component. In the conventional art, the focal point for the on-chip lens is for instance brought in proximity to the light-receive surface 34a of the sensor 34 by means of the aperture 36 of the light-impervious film 35, or in other words, formed to be at the same height as the overhang 35a.

An imaging device known in the conventional art, is shown for instance in the concept structural view of FIG. 10. An imaging device 50 has an imaging zone 39 with pixels arrayed vertically and horizontally on the silicon substrate 31, and further has a CCD solid-state image sensor 30 with the above mentioned cross sectional structure for these pixels. Said imaging device is further comprised of a camera lens system 40 comprising a diaphragm 42 and an imaging lens 41 installed above the CCD solid-state image sensor 30.

However, in the above-mentioned CCD solid-state image sensor 30, when light passes through the end of the on-chip lens 37 as shown in FIG. 9, a problem occurs in that the light A is reflected from the upper end (shoulder portion) of the light-impervious film 35 and exits on the outer side of the on-chip lens 37 and thus cannot enter the sensor 34 as intended. Further, the light B located more towards the center of the on-chip lens 37 than the light A, is reflected from the side surface of the light-impervious film 35 and also reflected from the overhang 35A for the light-impervious film 35 projecting over the sensor 34 so that light cannot enter the sensor 34. This problem, as is related later is thought due to the installation of the overhang 35A height in proximity to the focusing point of on-chip lens 37. The extent of light reflection at the light-impervious film 35 increases as the light contains more of these oblique light constituents such as the light A and B mentioned above. This increase is particularly drastic when the F number of the camera lens system 40 of the imaging device 50 is set to be a minimum or when the so-called pupil distance s from the diaphragm 42 of the camera lens system 40 to the light-receive surface 34a is short.

Whereupon, moving the on-chip lens closer or farther away from the light-receiving surface 34a of the sensor 34 was attempted as a countermeasure as well as changing the refraction index of the on-chip lens 70 however a portion of the light input is blocked by the light-impervious film 35 due to the structure of the above-mentioned CCD solid-state image sensor 30. Also in this structure, during the light entry process, the light C which is not blocked by the light-impervious film 35 is successfully incident upon the light-receiving surface 34A however a portion is reflected from the surface of the silicon substrate and does not enter the light-receive surface 34a.

Thus in the CCD solid-state image sensor 30 of the conventional art, even if light is concentrated with the on-chip lens 37 towards the sensor 34, this light will be reflected from the surface of the silicon substrate 31 or the light-impervious film 35 and exit on the outer side of the on-chip lens 37, failing to enter the sensor 34. In other words, many constituents of the light do not contribute to device sensitivity thus leading to decline in sensitivity in the CCD solid-state image sensor 31. The light reflected from the surface of the silicon substrate 31 is reported to be 30 percent or more.

Further, when the pupil distance s is short in the camera lens system 40 in the imaging device 50 of the conventional art shown in FIG. 10, light from the on-chip lens 37 of the camera lens system 40 will irradiate (be incident upon) the sensor 34 however, as related before this light contains a particularly large amount of oblique light constituents. Also, in FIG. 10, from among the input light, the concentrated light $E_1$ (hereafter referred to as the main light beam) which passes through the approximate center of the diaphragm 42, tends to spread out in an increasingly large angle from the center of the imaging zone 39 towards the periphery with respect to the light-receive surface 34a of the sensor 34, and when the distance s as shown in the figure is short, the oblique light constituents contained in the input light clearly increase as the light approaches the periphery of imaging zone 39. Consequently, the focusing point for the light from the on-chip lens deviates a slight amount at a time from the pixels at the approximate center of the aperture 36 of the light-impervious film 35 as the light shifts from the center of the imaging zone 39 towards the periphery. The focusing efficiency on the sensor 34 of the imaging zone 39 in particularly declines along with a drop in sensitivity and the problem of shooting occurs.

In order to resolve these problems, the conventional art attempted shifting the position of the on-chip lens 37 a slight amount at a time from the center of the imaging zone 39 and towards the periphery, thus offsetting or compensating the input light position according to the distance s as shown in FIG. 11, in an enlarged cross section (b) of an essential portion of FIG. 10. However, in this case also, the light E passing the end of the on-chip lens 37 is reflected from the upper edge of the light-impervious film 35 and cannot enter the sensor 34 due to the reason related before in which the focus point of the on-chip lens 37 is located near the same height as the overhang 35a. This method thus failed to adequately improve light focusing efficiency.

However as increasing progress is made in miniaturizing pixel size along with greater compactness of the CCD solid-state image sensor 30, the need for setting the physical thickness of the light-impervious film 35 to a certain extent vertically becomes more essential however, making the light-impervious film 35 thinner is difficult. Further, the smear constituents cannot be increased so that a covering for the light-impervious film 35 above sensor 34 is needed, in other words making an overhang 35 necessary. Accordingly, when the pixel size is further reduced, the position from the edge of the light-impervious film 35 to the light-receive surface of the sensor 34 (to the approximate focus point) becomes correspondingly deeper. As a result, even if light is focused by the on-chip lens, the constituents reflected by the light-impervious film 35 increase just as related above for the light A, B, E so that focusing efficiency onto the sensor 34 declines and sensitivity is reduced. A particularly drastic drop in sensitivity occurs for light with a small pupil distance when the F value is set to a minimum. Accordingly, miniaturizing the size of the pixels presents problems.

Whereupon, the inventors made repeated evaluations on how to resolve the above problems and obtained the following conclusions. When the on-chip lens 37 is moved far from the light-receive surface 34a of the sensor 34 and also when the focus point is set near the height position of the overhang 35a at the aperture 36 of the light-impervious film 35 as shown in FIG. 6A, or restated, when the focal point length is increased, a large deviation in the focus position occurs on the light-receive surface 34a so that of the light entering the sensor 34, the oblique light $D_1$, $D_2$, which passed the end of the on-chip lens 37 strikes the overhang 35a of the light-impervious film 35 and is reflected. Accordingly, the left and right oblique light $D_1$, $D_2$ do not contribute to the sensitivity of the solid-state imaging sensor.

On the other hand, when the curvature of the on-chip lens is increased and the on-chip lens is brought near the light-receive surface 34a of the sensor 34, and the focus point is set at a position with a height equivalent to the upper end of the light-impervious film 35 (shoulder portion) and above the aperture 36 of the light-impervious film 35 as shown in FIG. 6B, or in other words, when the focus point length is shortened, then the deviation width of the focus point position becomes smaller on the light-receive surface 34a, reflection from the upper edge of the light-impervious film 35 is suppressed and both the left and right oblique light $D_1$, $D_2$ can enter at the aperture 38 formed at the side surface on the side of the aperture 36 of the light-impervious film 35 as shown in FIG. 6A. When light is input into the aperture 38, the oblique light $D_1$, $D_2$ advances while reflected by the side surface of light-impervious film 35, thus contributing to the sensitivity of the solid-state imaging sensor. This arrangement can reduce the loss of sensitivity from light having many oblique light constituents such as when the F value is set to a minimum or when the light has a short pupil distance due to the camera lens diameter.

SUMMARY OF THE INVENTION

Accordingly, it is an object of the present invention to provide a solid-state imaging sensor, a method for manufacturing the solid-state imaging sensor and an imaging device of which said solid state image sensor is designed to reduce unwanted light reflections, improve light focusing of light reflections from the substrate and oblique light constituents onto the sensor in order to allow further reduction in pixel size.

Whereupon the inventors developed this invention based on the above arrangement. In other words, a solid-state imaging sensor has a light-impervious film covering a transfer electrode formed on the substrate with an aperture or opening directly above a sensor, and has overhangs projecting towards the center of the sensor from the side surface position at respectively the top and bottom edges of the side surface with the opening directly above this sensor, and the lens for converging the input light onto the sensor installed above the light-impervious film has a focus point at a position directly above the light-impervious film aperture (opening) is at a position equivalent to the height of the tip of the overhang installed at the top edge of the side surface.

Since the lens in this solid-state imaging sensor is formed so as to have a focus point at a position equivalent to the height of the tip of the overhang installed at the top edge of the side surface of the light-impervious film at the aperture directly above the sensor, when for instance the lens is positioned at a height the same as in the conventional art, the light-receiving surface of the sensor is effectively at a high position and the focus point distance becomes short. As related before, when the focal distance is short, the deviation width of the focus position at the light-receiving side of the sensor becomes small, and nearly all of the oblique light constituents contained in the light input to the sensor are input into the aperture (opening) contained in the side surface of the light-impervious film.

Further, since the overhang is installed at the top edge of the side surface of the light-impervious film, the aperture contained in the side of the light-impervious film where the upper circumferential edge is enclosed by the overhang. Accordingly, even if the oblique light constituents entering into this aperture are reflected at the side surface of the light-impervious film and the bottom edge of the overhang to face towards the outer side of said aperture, this light is prone to reflect at the upper overhang without exiting at the outer side of the aperture. As a result, even if the light entering inside the aperture is reflected at the light-impervious film, this reflection will repeat several times and ultimately the light will beam upon the light-receive surface of the sensor, thus increase the percentage of input light. Also, of the light beaming onto the light-receive surface of the sensor, at least a portion of the light reflecting many times from the upper overhang and the side surface of the light-impervious film will reenter the light-receiving surface. Accordingly, a drastic increase in light convergence efficiency of light constituents onto the sensor at the light-receive surface can be achieved. Further, the generation of smear can be suppressed by the overhang installed at the bottom of the side surface of the light-impervious film.

In the manufacturing method for the solid-state imaging sensor of this invention, an intermediate piece is utilized which is comprised of a discrete sensor for photo-electric conversion and a transfer electrode on the substrate. On this intermediate piece is a first light-impervious film to block light from entering other than the sensor, cover the transfer electrode and formed with an aperture directly above the sensor, and also having a lower overhang installed to protrude towards the center of the sensor from a side surface position in which the bottom of a side surface has an aperture directly above the sensor of the first light-impervious film. Next, an insulating film is formed to cover the first light-impervious film on the substrate, then a contact hole is formed to make the upper surface of the first light-impervious film face the outer side at the insulating film or to contact the upper surface of the first light-impervious film. Next, along with forming on said insulating film, a material film made from materials having light blocking characteristics, the inner surface of the contact hole is covered and afterwards an edge piece is formed from this material film by an aperture directly above this sensor, etching performed to obtain a position for the edge piece at the center of the sensor rather than the side surface forming the contact hole inner surface and the second light-impervious film obtained.

Also in the manufacturing method for the solid-state imaging sensor of this invention, once the contact hole has been formed in the insulating film, the material film is formed having light blocking characteristics so that the inner surface is covered. This material film is etched in order to obtain the second light-impervious film so that a side surface which is the surface open at a position directly above the sensor of the second light-impervious film is made by the material film covering the side surfaces of the contact hole inner surface. Further, since this etching which makes an edge piece formed by means of the aperture of the material film is to create a position towards the center of the sensor rather than the side surface of the contact hole; an upper overhang is formed from the tip of the edge piece formed by means of said aperture and the overhang protrudes towards the center of the sensor rather than from the top of the side surface of the second light-impervious film. Also, since an aperture is made at a position directly above the sensor by means of etching, the size and the forming position of the second light-impervious film aperture can be adjusted freely and easily as needed.

Further, since said contact hole is formed to face the outer side of the upper surface of the first light-impervious film or formed in proximity to the upper surface of the first light-impervious film, the second light-impervious film is thus formed in contact with the upper surface of said first light-impervious film or in proximity to the first light-impervious film. Accordingly, the first and second light-impervious films function as a light isolation zone for the adjoining pixels and light is prevented from escaping from between the first and second light-impervious films.

The imaging device of this invention is comprised of solid-state imaging sensors having imaging zones made from arrays of pixels positioned horizontally and vertically on a substrate wherein, said imaging zones are comprised of line-shaped electrodes arrayed between pixel rows facing vertically on the substrate, discrete sensors to perform photo-electric conversion installed between the lines of said transfer electrodes on said substrate, a light-impervious film to block the input of light into other than said sensor installed with an aperture directly above said sensor and also installed on said substrate to cover said transfer electrode, and a lens to converge the input light onto said sensor provided for each pixel above the light-impervious film wherein, said light-impervious film has overhangs facing towards the approximate center of said sensor from a side surface position, at respectively the top and bottom edges of said side surface with an aperture directly above said sensor, and said overhang installed at the top edge of the side of the light-impervious film is formed with an aperture in an offset position facing from the approximate center of said imaging zone towards the periphery so that the focus point is positioned at the approximate center of the aperture formed so as to be enclosed by said overhang.

Further, in the imaging device of this invention, just as with the solid-state imaging sensor of the invention, a lens is formed at a position where the aperture (opening) of the light-impervious film is directly above the sensor and with a focus point at height equivalent with the edge of the overhang formed on the top edge of the side of the light-impervious film, and the same function as the above-mentioned solid-state imaging sensor of the invention is obtained since overhangs are respectively provided at both the top and the bottom of the side surface of the light-impervious film, and since the upper overhang of the top edge of the side surface of the light-impervious film is formed with an aperture in an offset position facing towards the periphery from the center of the imaging zone so that the focus point is at the center of the aperture formed by said overhang, not only the light constituents at the center of the imaging zone but also the oblique light constituents at periphery can converge well into the aperture enclosed by the side surfaces of the light-impervious film with good efficiency. Accordingly, even if the light beaming onto the sensor has a short pupil distance and the oblique light constituents drastically increase along with the distance from the center of the imaging zone to the periphery, there will be no gradual deviation in lens position from center of the imaging zone towards the periphery, and a great increase in light convergence efficiency onto the sensor at the periphery of the imaging zone will be obtained.

BRIEF DESCRIPTION OF THE DRAWINGS

FIG. 7 is a concept structural view showing the first embodiment of the imaging device of this invention.

DETAILED DESCRIPTION OF THE PREFERRED EMBODIMENTS

Hereafter, the embodiment of the solid state imaging sensor, method for manufacturing the solid-state imaging sensor, and an imaging device relating to this invention will be explained while referring to the accompanying drawings.

Figure 1:
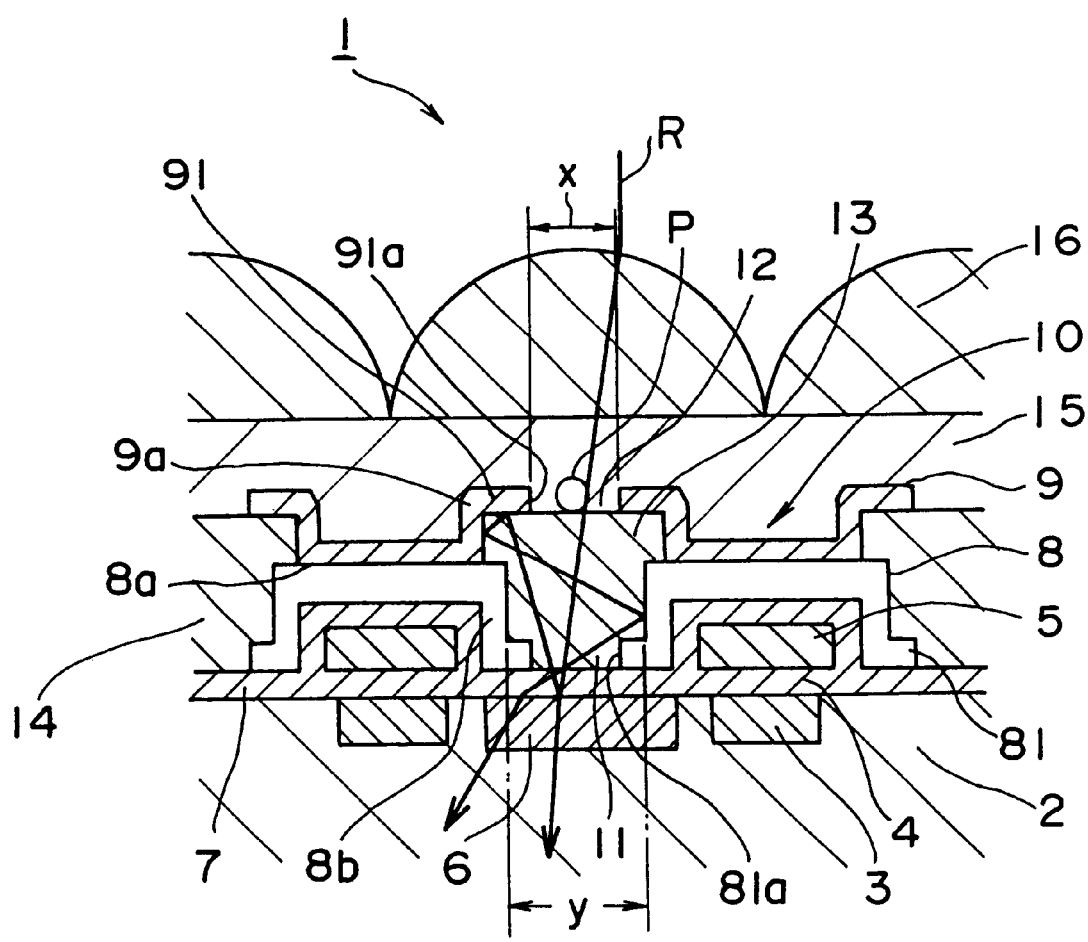
FIG. 1 is a cross sectional view of an essential portion showing the first embodiment of the solid state imaging sensor of this invention.

FIG. 1 is a cross sectional view of an essential portion of the CCD solid-state image sensor of the first embodiment of the solid state imaging sensor of this invention, showing in particular the pixel zone which is a characteristic of this invention.

The CCD solid-state image sensor as shown in FIG. 1 is formed at the boundaries between the line-shaped perpendicular transfer section 3 on the substrate formed for instance from silicon. A line-shaped transfer electrode 5 is formed by way of a gate insulator film 4, on a substrate 2 and directly above the perpendicular transfer section 3. A discrete sensor 6 is formed on the substrate 2 at specific intervals between the lines of the transfer electrodes 5 at specified intervals. The sensor 6 is the zone where the input light R is converted into a signal charge and accumulated. The transfer electrode 5 is a zone that transfers the signal charges accumulated by the sensor 6 in the line direction.

A first insulator film 7 is formed to cover the transfer electrode 5 on the substrate 2. On this first insulator film 7, a light-impervious film 10 is formed with an aperture at a position directly above the sensor 6 and covering the transfer electrode 5. The light-impervious film 10 is formed from a first light-impervious film 8 and from a second light-impervious film 9 formed in a state in contact with the upper surface 8a on the first light-impervious film 8. The first light-impervious film 8 and the second light-impervious film 9 both have an aperture at a position directly above the sensor 6 (hereafter, the aperture of the first light-impervious film 8 is referred to as the "first aperture 11" and the aperture of the second light-impervious film 9 is referred to as the "second aperture 12").

At the first light-impervious film 8, on the bottom of a side surface 8b forming the side surface of the first aperture 11, a lower overhang 81 is formed projecting from the position of side surface 8b to the center of the sensor 6. Also, at the second light-impervious film 9, at the top of a side surface 9 forming the side of the second aperture 12, a upper overhang 91 is formed projecting from the position of side surface 9a to the center of the sensor 6. Accordingly, the side surface 8b of the first light-impervious film 8 and the side surface 9a of the second light-impervious film 9 are enclosed by the upper overhang 91 and an aperture 13 is formed with the second aperture 12 of second light-impervious film 9 as the entrance and the first aperture 11 of the first light-impervious film 8 as the exit.

In this embodiment, the overhang 91 of the second light-impervious film 9 and the lower overhang 81 of the first light-impervious film 8 are formed to project in parallel versus the surface of the substrate 2. In the second light-impervious film 9, and at a position below this edge 9a, the x dimension of an edge 9a of the upper overhang 91 enclosing the second aperture 12 from opposing directions is formed as a smaller dimension than the y dimension of the side surface 8b enclosing the aperture from opposing directions by the first light-impervious film 8.

While the light R enters the sensor 6 by way of the second aperture 12 of the second light-impervious film 9, aperture 13 as well as the aperture 11 of the first light-impervious film 8; this light R is blocked by the first light-impervious film 8 and the second light-impervious film 9 from entering any location except the sensor 6. Further, since the second light-impervious film 9 is formed in contact with the upper surface 8a of the first light-impervious film 8 so that the first light-impervious film 8 and the second light-impervious film 9 form a light isolation region between the adjoining pixels and light is prevented from leaking onto adjoining pixels from the boundary between first light-impervious film 8 and the second light-impervious film 9.

The material from which the first light-impervious film 8 and the second light-impervious film 9 are formed may be any material provided that the light R can be blocked. Examples of suitable materials are for instance, tungsten (W), tungsten silicide (WSi), titanium (Ti) and aluminum (Al), cobalt (Co), copper (Cu), and molybdenum (Mo), etc. Further, the first light-impervious film 8 and the second light-impervious film 9 may be made of the same or of different materials.

The second insulator film 14 above the first insulator film 7, and inside the aperture 13 formed from the first light-impervious film 8 and the second light-impervious film 9, is made from an insulator film of this invention having insulating properties and also permeable to the light R. The second insulator film 14 has a flat level surface and is formed from a flattened film. The upper overhang 91 is formed on the second light-impervious film 9 on the surface of the second insulator film 14. This type of second insulator film 14 may utilize for instance, spin-on-glass film (SOG), ozone ($O_3$)-TEOS (tetra ethoxy silane) type plasma CVD (CVD; chemical gas phase) film, silicon nitride (TiN) film, and silicon oxide ($SiO_2$) film etc.

An intralayer film 15 is formed in order to cover the second light-impervious film 9 on the second insulator film 14. The intralayer film 15 is formed with sequential layers not shown in the drawing, consisting of a flat film permeable to the light R and a color filter film, on the light-impervious film 10. Above this light-impervious film 10 and by way of the intralayer film 16, an on-chip lens 16 for converging the light R onto the sensor 6 is provided for each pixel or in other words, each sensor 6. A focus point P for the on-chip lens 16 is at a position directly above the sensor and approximately the same height as the edge 91a for the upper overhang 91, or in other words formed so as to be installed at the second aperture 12 position.

Figure 2A:
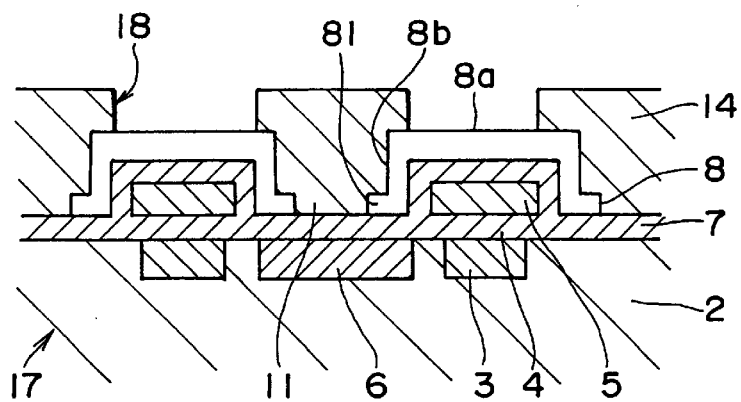
FIGS. 2A through 2C illustrate the work procedure for the manufacturing method for the CCD solid-state image sensor of the first embodiment of the solid state imaging sensor of this invention.
Figure 2B:
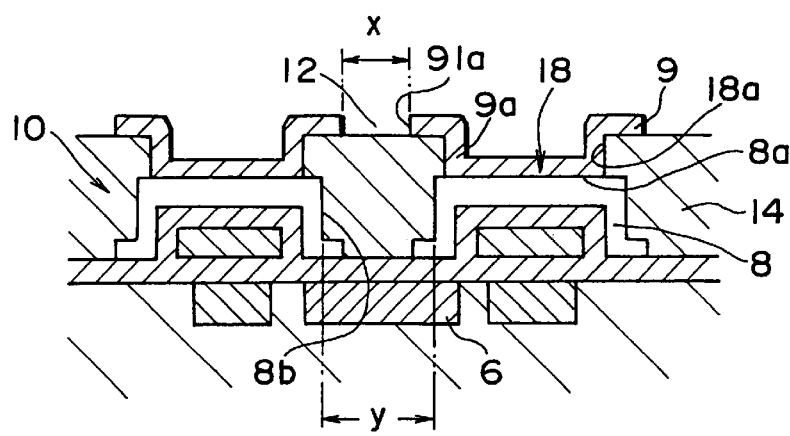
Figure 2C:
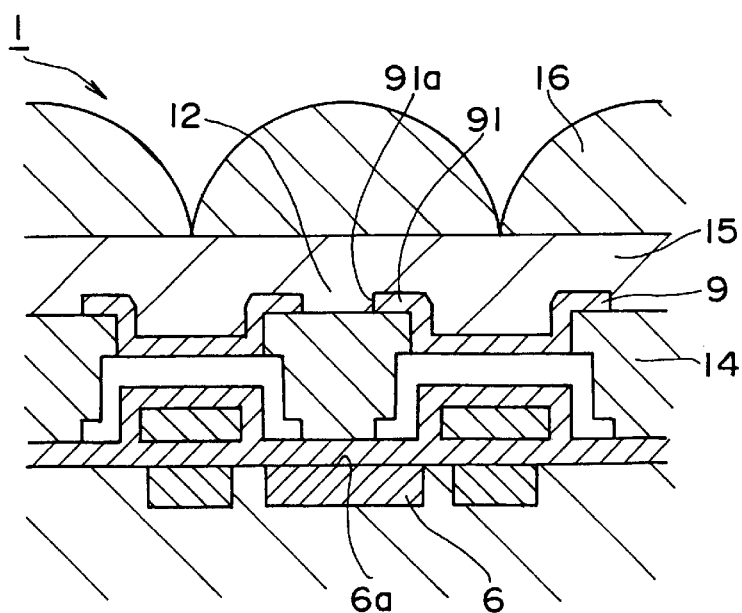

Next, the manufacturing method for the solid-state imaging sensor of this invention is described based on the manufacturing method for the CCD solid-state image sensor 1 configured as described previously. FIGS. 2A through 2C are cross sectional views showing essential portions of the process sequence for the CCD solid-state image sensor 1. First, in order to understand the manufacturing method of the CCD solid-state image sensor of this invention, in the conventional art, along with forming a sensor 6 and a perpendicular transfer section 3 on the substrate 2, a gate insulator film 4, a transfer electrode 5 and a first insulator film 17 to cover this transfer electrode 5 are formed to obtain an intermediate piece 17 as shown in FIG. 2A.

Next, just the same as when forming the light-impervious film of the conventional art, a first light-impervious film 8 is formed by means of the first insulator film 7 on the substrate 2 of this intermediate piece 17. For instance, a material film (not shown in drawing) is formed from for example of aluminum film for a first light-impervious film 8, on the entire surface of the substrate 2 by a for instance a sputtering method or CVD method. Next, a first light-impervious film 8 open directly above the sensor 6 of the material layer and a first aperture 11 for this first light-impervious film 8 formed by lithography and sputtering. Also in this case, at the bottom of side surface 8b of the first light-impervious film 8, etching is next performed so that a lower overhang 81 is formed to project from the side surface 8b to the center of the sensor 6.

Next, a second insulator film 14 is formed having a flat surface to cover the light-impervious film 8 on the full surface of the substrate 2. In order to form this second insulator film 14, for example, an SOG or $O_3$-TEOS type plasma CVD processing having excellent smoothness is performed. Alternatively, after forming a film of SiN, $SiO_2$ with this plasma CVD method, the applicable surfaces are formed to be flat and level by etching. Also, mechanical chemical polishing methods may also be utilized as methods to achieve flatness and levelness. Lithography and etching may be used to form a contact hole 18 making the upper surface 8a of the first light-impervious film 8 face outwards at the second insulator layer 14. At this time, the first light-impervious film 8 functions as an etching stopper.

Next, along with forming the material film (not shown in drawing) on the entire surface of the substrate 2 from for instance, the aluminum film for the second light-impervious film 9 onto the second insulator film 14 by means of for instance, a sputtering method or a CVD method as shown in FIG. 2B, the inner surface of the contact hole 18 is covered with the material film. Next, the second light-impervious film 9 is obtained by etching the material film. At this time, an opening is made directly over the sensor 6 and the edge piece formed by this opening or aperture is formed by etching to attain at a position more at the center of the sensor 6 rather than the side surface 18a of the contact hole 18 or the side surface 8b of the first light-impervious film 8.

As a result, a second light-impervious film 9 having a side surface 9a formed to cover the side surface 18a of the contact hole 18, and an overhang 91 projecting more towards the center of the sensor 6 than the side surface 9a on the surface of the second insulator film 14, and a second aperture 12 of the second light-impervious film 9 are formed. The edge piece formed of an opening or aperture by etching of said second light-impervious film 9 functions as the edge 91a of the upper overhang 91. Also, the x dimension of the edge 91a facing relative to the upper overhang 91 of the second light-impervious film 9 is formed to be a smaller than dimension y of side surface b of the first light-impervious film 8. The second light-impervious film 9 is formed to contact the upper surface 8a on the first light-impervious film 8, and the forming of a light-impervious film 10 from the first light-impervious film 8 and the second light-impervious film 9 is complete.

After forming the light-impervious film 10, as shown in FIG. 2C for the conventional art, the color filter film and a smoothing permeable film are laminated in sequence on a second insulator film 14 to form the intralayer film 15 in order to cover the second light-impervious film 9, and an on-chip lens 16 formed on the intralayer film 15. In this case, the distance and curvature of the on-chip lens 16 is adjusted and the on-chip lens formed so the focus point height position is equivalent with the edge 91a of the overhang 91 directly above the sensor 6. The on-chip lens 16 can be formed for instance to have the same height position as the conventional art and with a large curvature. Alternatively, the on-chip lens 16 can be brought near the light-receive surface 6a side of the sensor 6 and the on-chip lens 16 formed with a large curvature. The CCD solid-state image sensor 1 is thus manufactured according to the above process.

The CCD solid-state image sensor manufactured in the above related process is provided with a focus point P at the position of the second aperture 12 so that for instance, the focus point distance is shortened when the on-chip lens position is set to the same height as in the conventional art. Accordingly, when the deviation width of the focus P position at the light-receive side of the sensor 6 is small, the reflection from the light-impervious film 10 of the oblique light constituents contained in the light R entering the sensor 6 can be suppressed. Accordingly, virtually all of the oblique light constituents of the light R as shown in FIG. 1, can enter inside the aperture 13 formed so as to be enclosed by the lower overhang 81, the side surface 8b of the first light-impervious film 8, the side surface 9a of the second light-impervious film 9, and the upper overhang 1.

The upper circumference edge of the aperture 13 is enclosed by the upper overhang 91 at the top of the side surface 9a of the second light-impervious film 9. In particular, the x dimension of the edge 91a relative to the upper overhang 91 of the second light-impervious film 9 is formed smaller than the dimension y of the side surface 8b of the relatively positioned first light-impervious film 8 so that the entrance to the aperture 13 becomes narrow. Therefore, even if the oblique light entering into the aperture 13 is reflected at the side surface 8b of the first light-impervious film 8, the side surface 9a of the second light-impervious film 9 the lower overhang 81 and faces towards the outer side of the aperture 13, the light will be prone to reflect at the upper overhang 91 and not exit the outer side of the aperture 13.

Consequently, a high percentage of the light R input into the aperture 13 will repeatedly reflect several times at the first light-impervious film 8 and the second light-impervious film 9 and ultimately enter the light-receive surface 6a of the sensor 6 so that the focus rate (convergence efficiency) of oblique light constituents onto the sensor 6 can be drastically increased. As a result, even if the light has an F value set to a minimum or even if the light has a short pupil distance in the camera lens system, the many oblique light constituents contained in these different kinds of light so that sensitivity is improved and shooting is suppressed.

Further, of the light R being input to the light-receive surface 6a of the sensor 6, and the light constituents reflected at the light-receive surface 6a, at least a portion of the light undergoing multiple reflections at the side surface 8b of the first light-impervious film 8, the side surface 9a of the second light-impervious film 9 and upper overhang 91, and lower overhang 81 can be input again into the light-receive surface 6a. This arrangement is extremely effective when the light-receive surface 6a of the sensor 6 has large pixels. Thus, since both the oblique light constituents and the light constituents reflected at the light-receive surface 6a have a good convergence efficiency onto the sensor 6, a large improvement in sensitivity can be obtained. Also, since smear can be suppressed by means of the lower overhang 81, satisfactory optical characteristics can be maintained and the pixel size can be miniaturized.

In the manufacturing method for the above-mentioned CCD solid-state image sensor 1, a material film having light-impervious characteristics is formed so as to cover the inner circumference of the contact hole 18, and an aperture formed directly over the sensor 6 position by etching in order to be able to freely and easily adjust the size of the second aperture 12 of the second light-impervious film. The e forming position of the second aperture 12 can also be easily adjusted. In the conventional art however, when the pupil distance per the light source of the camera lens system is short, the light input position onto the sensor cannot be offset or compensated at the light-impervious film so the light input position was offset or compensated by adjusting the on-chip lens pitch according to the pupil distance. In this embodiment however, the light input position onto the sensor 6 can be easily adjusted by shifting the two-dimensional flat surface of the substrate 2 according to the pupil distance to form the second aperture 12. As a result, a CCD solid-state image sensor 1 with low shooting can be manufactured for a light source with a short pupil distance.

When compensating the input position of the light R onto the sensor 6 by forming the position of the second aperture 12 of the second light-impervious film 9, rather than position alignment by lithography when forming the on-chip lens 2, a lithography process is utilized to attain position alignment for forming the second aperture 12. Accordingly, improving the alignment precision and performing more accurate molding of the second aperture 12 at the specified position allows offsetting the input position for the light R onto the sensor 6 with better accuracy.

The above embodiment of this invention described a light-impervious film comprised of two films; a first light-impervious film and a second light-impervious film however a structure can be utilized comprising a light-impervious film of one layer and overhangs provided at respectively the top and bottom of the side surface having an opening or aperture positioned directly above the sensor. The above embodiment also described an example in which a second light-impervious film was formed in a state in contact with the upper surface of a first light-impervious film however, the second light-impervious film may also be formed in proximity to the upper surface of the first light-impervious film. In such a case, forming the second light-impervious film in proximity to upper surface of the first light-impervious film to such an extent that no light leaks onto the adjacent pixels from between the first light-impervious film and the second light-impervious film is necessary. When forming a second light-impervious film with this arrangement, the contact hole formed at the second insulator film may for instance be formed in proximity to the upper surface of the first light-impervious film.

Also in the above embodiment, an example was described in which the overhang of the second light-impervious film was formed to project in parallel with the surface of the substrate however, this invention is not limited to the case where the overhang is formed to face more towards the center of the sensor than the side surface with the opening (aperture) at a position directly above the sensor of the second light-impervious film. For instance, the upper overhang 92 can be formed from the top of the side surface 9a of the second light-impervious film 9 to project obliquely upwards as shown in the first variation in FIG. 3. Further, the upper overhang 93 may also be formed from the top of the side surface 9a of the second light-impervious film 9 in a state projecting obliquely downwards as shown in the second variation in FIG. 4.

In both the first and second variations listed above, when the dimensions of the edges 92a, 93b facing relative to the upper overhang 92 of the second light-impervious film 9 are formed smaller than the dimensions for the side surface 8b of the first light-impervious film, the high light focusing efficiency on the sensor 6 is satisfactory. Further, the focus point for the on-chip lens 16 is formed at a position with a height equivalent to the edges 92a, 93a the upper overhangs 92, 93 or in other words, formed at the position of the aperture 12 of the second light-impervious film 9.

When manufacturing a second light-impervious film 9 such as in the above first variation, a contact hole 18 may for instance be formed in the second insulator film 14 with a taper added to the side surface 18a and other than the shape of the contact hole 18, the remainder of the manufacturing method procedure performed as explained in the above embodiment. When manufacturing a second light-impervious film 9 such as in the above second variation, the surface of the second insulator film 14 for instance may be formed with irregularities (concavities/protrusions) and the remainder of the manufacturing method procedure performed as explained in the above embodiment.

In the CCD solid-state image sensor 1 of both the first and second variations, an aperture 13 is formed enclosed by the lower overhang 81, side surface 8b of the first light-impervious film 8, the side surface 9a of the second light-impervious film 9, and the upper overhangs 92, 93. The entrance to the aperture is narrowed by the upper overhangs 92, 93 of the second light-impervious film 9. Therefore, oblique light constituents of the light R are input to the aperture 13 and even if light is reflected inside the aperture 13 to fact the outer side of the aperture 13, this light will tend to reflect at the upper overhang 91 without exiting the aperture 13 so that a large scale improvement in light focusing efficiency of oblique light constituents onto the sensor 6 can be obtained. Also, even the oblique light constituents reflected at the light-receive surface 6a from among the light R and at least a portion of the light that underwent multiple reflection inside the aperture 13 can be reentered onto the light-receive surface 6a to obtain improved focusing efficiency onto the sensor 6. Accordingly, the first and second variations can achieve the same effect as the above embodiment.

Figure 5:
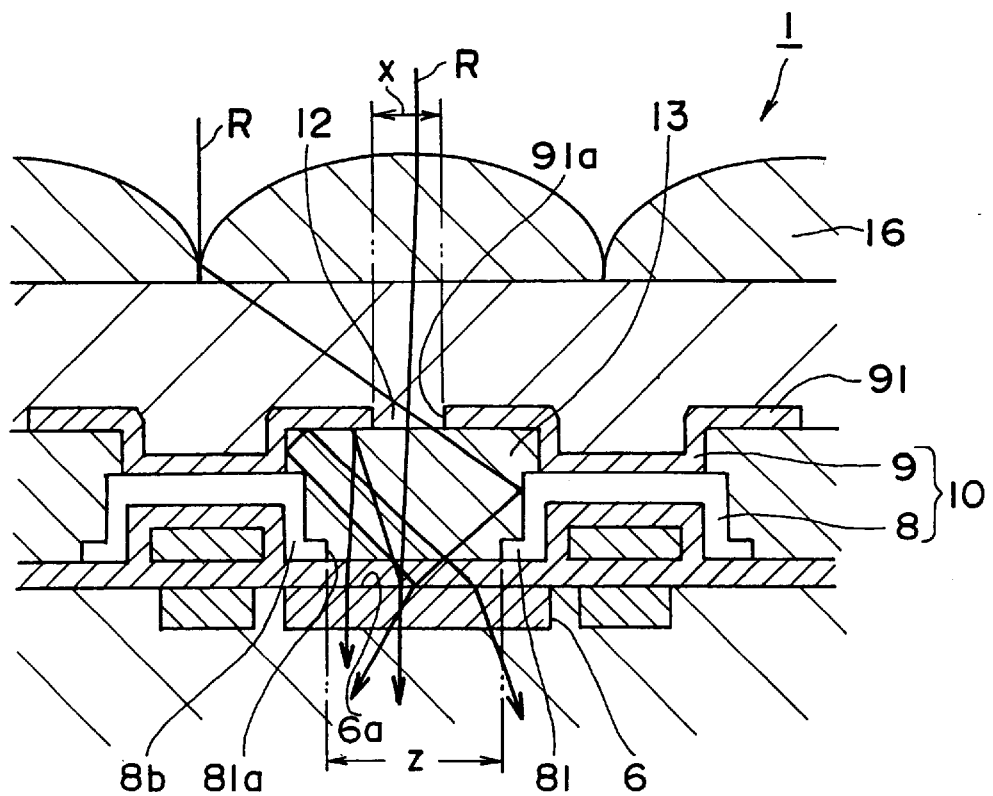
FIG. 5 is a cross sectional view showing an essential portion of the third embodiment of the invention.
Figure 6A:
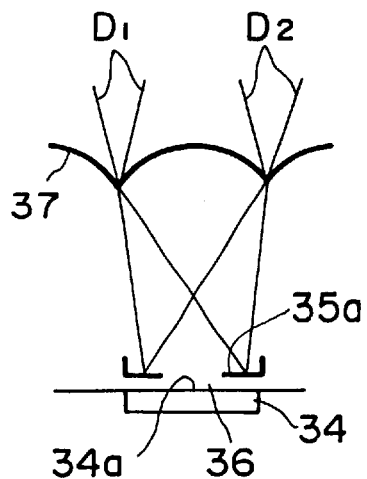
FIGS. 6A and 6B illustrate the principle of this invention.
Figure 6B:
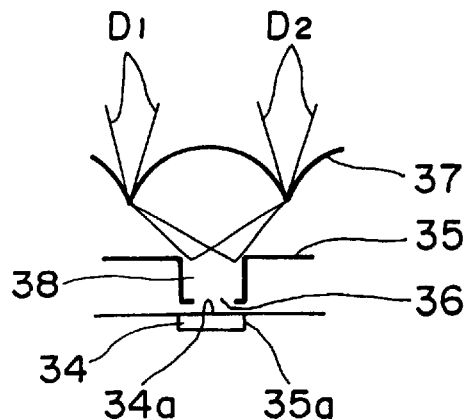

Further in the above embodiment, an example was related in which the dimensions of the edge pieces relative to the upper overhang of the second light-impervious film 9 were formed with smaller dimensions than the side surface of the first light-impervious film. However, the dimension x of the edge 91a relative to the upper overhang 91 of the second light-impervious film 9, as in the third variation shown in FIG. 5, may be formed smaller than the dimension z for the edge 81a of the lower overhang 81 relative to the first light-impervious film 8 below the edge 91a. In this third variation, the focus point of the on-chip lens 16 is at a position with a height equal to the edge 91a of the upper overhang 91, in other words at the position of the aperture 12 of the second light-impervious film 9.

In the third variation, since the second aperture 6 enclosed by the upper overhang 91 is even smaller, the oblique light constituents of the light R input into the aperture 13 enclosed by the upper overhang 91, even if reflected inside the aperture 13 and facing outwards, are prone to be reflected at the upper overhang 91. The light constituents in particular, reflected from the light-receive surface 6a from among the light R input onto the light-receive surface 6a of the sensor 6, are reflected at the surface of the upper overhang 91 to face the aperture 13 and reenter the light-receive surface 6a at a high percentage. Accordingly, a CCD solid-state image sensor 1 with improved sensitivity can be obtained to allow a still further improvement in light focusing efficiency onto the sensor 6. This third variation is particularly effective on a light-receiving surface having large pixels.

Here, this third variation related an example in which the light-impervious film was made from two films; a first light-impervious film and a second light-impervious film. However, even in a case in which only one light-impervious film is utilized and the upper edge and lower edge for the side surface with the aperture positioned directly above the sensor, the dimensions for the edge of the overhang formed on the top can be formed to smaller dimensions the edge of the overhang formed at the bottom, to therefore allow a still further improvement in sensitivity equivalent to the third variation.

Figure 8:
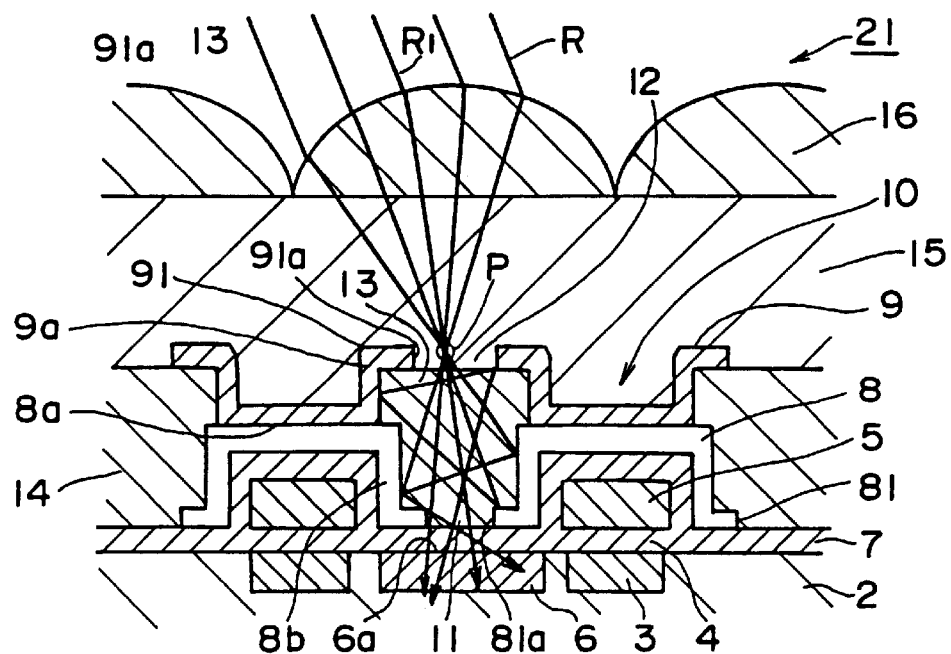
FIG. 8 is a cross sectional view showing an essential enlarged portion (a) of in FIG. 7.
Figure 9:
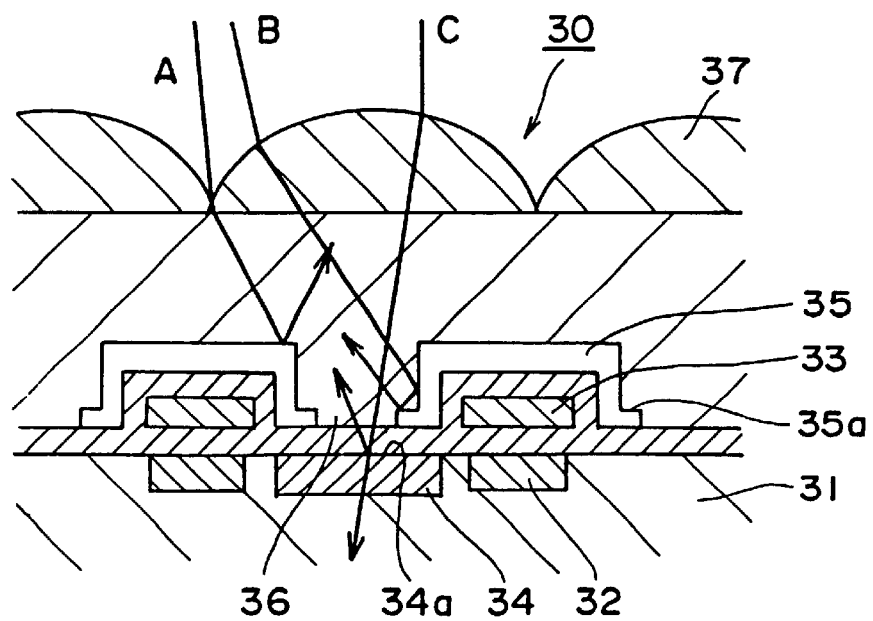
FIG. 9 is a cross sectional view of an essential portion illustrating an example of the CCD solid-state image sensor of the conventional art.
Figure 10:
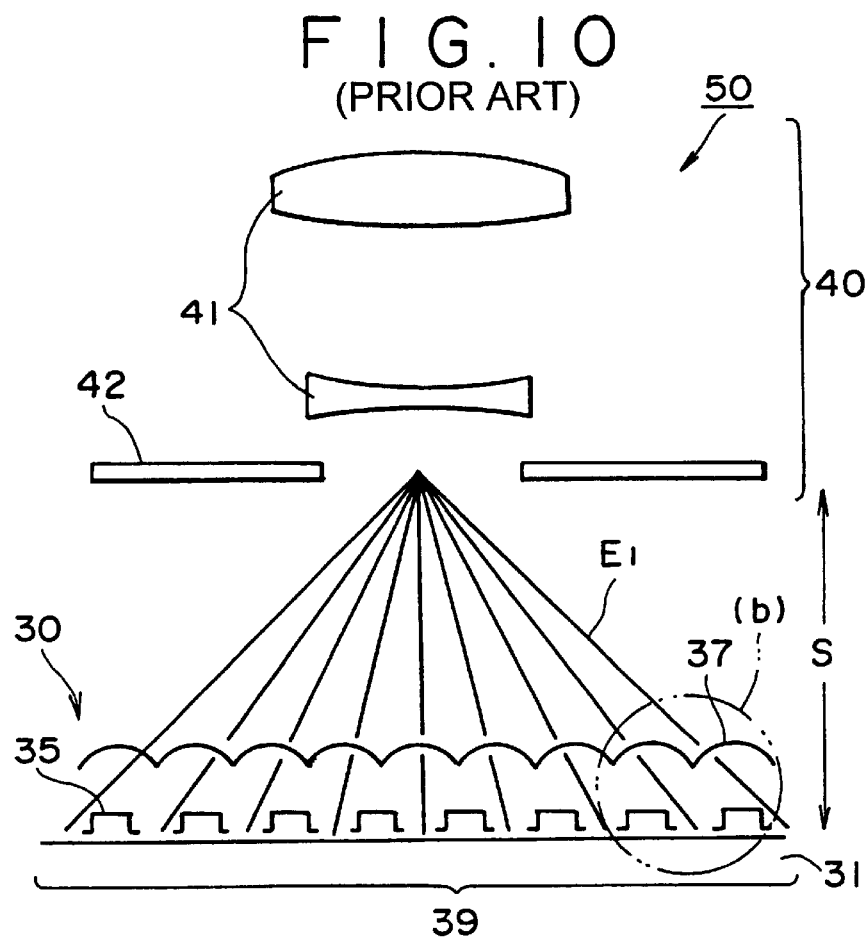
FIG. 10 is conceptual structural view showing an example of the imaging device of the conventional art.
Figure 11:
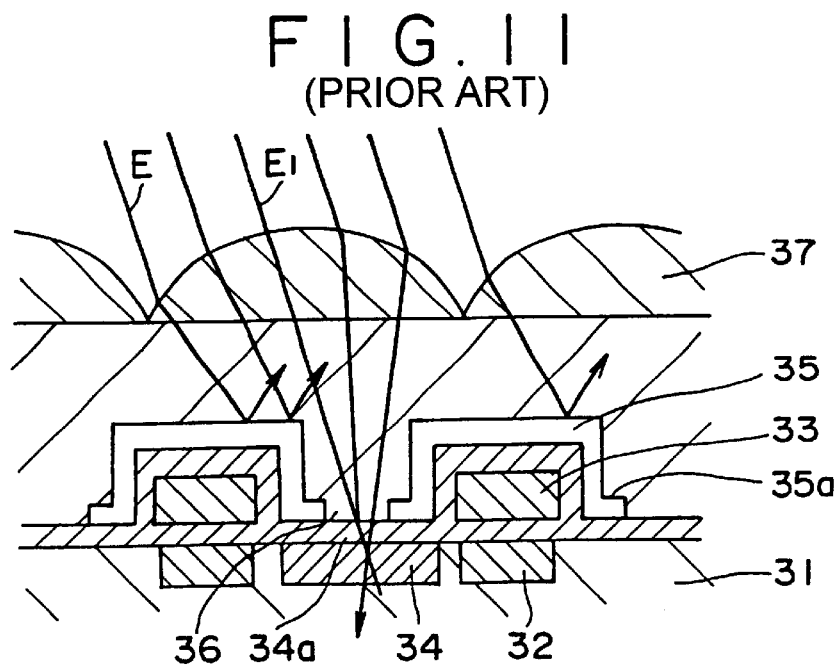
FIG. 11 is an enlarged cross sectional view of an essential portion (b) in FIG. 10.

Next, the first embodiment of the imaging device of this invention was described by utilizing FIG. 7 and FIG. 8. Parts of FIG. 7 and FIG. 8 which have reference numerals identical to the embodiment shown in FIG. 1 are omitted. FIG. 7 is a concept structural view showing an example of the first embodiment of the imaging device of this invention. All structural elements other the substrate, light-impervious film, and on-chip lens of the CCD solid-state image sensor are omitted. FIG. 8 is an enlarged cross sectional view of the essential portion (a) of FIG. 7.

The imaging device 20 has a CCD solid-state image sensor 21 provided with an imaging zone 21a comprising an array of respectively arranged vertical/horizontal pixels on the silicon substrate 2 forming the substrate of this invention, and a camera lens 40 provided above the on-chip lens 16 of the CCD solid-state image sensor 21. The camera lens 40 is comprised of an imaging lens 41 and diaphragm 42 just the same as in the conventional art and here the pupil distance s is short. The imaging lens 41 was comprised of two lens as shown in the example in FIG. 7 however more than two lenses may be used as for example a zoom lens, etc.

On the other hand, the pixels of the imaging zone 21a of the CCD solid-state image sensor 21 as shown in FIG. 8 have a cross sectional structure the same as described for the CCD solid-state image sensor 1 utilizing FIG. 1. However, the line-shaped perpendicular transfer electrode 3 is formed in the vertically facing pixel rows on the substrate 2. A discrete sensor 6 is formed for each pixel on the substrate 2 between the line of transfer electrodes 5 on the substrate 2.

Just as with the CCD solid-state image sensor 1 shown in FIG. 1, a first light-impervious film 8 having a first aperture 11 and a lower overhang 81, and a light-impervious film 10 comprised of a second light-impervious film 9 having an upper overhang 91 and a second aperture 12; an aperture 13, a second insulator film 14, an intralayer film 15 and an on-chip lens 16 are formed on the substrate 2. Accordingly, the on-chip lens 16 has a focus point P directly above the sensor 6 at a position with a height equivalent to the edge 91a of the upper overhang 91, in other words formed at the position of the second aperture 12.

The upper overhang 91 is formed in a state facing from the center of the imaging zone 21a to the periphery at a position offset from the second aperture 12 so that the focus position P formed by means of this enclosed state is aligned at the center of the second aperture 12. Here, the main light beam R₹1 ₹ from among the light R on sensor 6 is the light passing the diaphragm 42 of the camera lens 40 as related above and focusing onto the focus point P.

Accordingly, in this imaging device 20, the main light beam $R_1$ incidenting on the sensor 6 for pixels at the center and the periphery of the imaging zone 21a, passes through the center of the second aperture 12, and the light input position for all constituents of the light R for incidenting on the pixels of the sensor 6 is compensated (offset). Therefore, since the pupil distance s of the camera lens system 40 is short, the main light beam $R_1$ inputs onto the light-receiving surface 6a of the sensor 6 in a gradually increasing angle during the transit from the center of the imaging zone 21a to the periphery, so that even with a particularly large increase in the oblique light constituents contained in the light R towards the periphery, the above-related offset (compensation) will yield increased light focusing efficiency even at the periphery.

The CCD solid-state image sensor 21 of the imaging device 21 can be formed with the same process as in the manufacturing method for the CCD solid-state image sensor 1 of the embodiment. A second aperture 12 can be processed from the material film having light blocking characteristics by means of the lithography and etching processes.

The imaging device 20 of this embodiment has a CCD solid-state image sensor 21 with the same cross sectional structure as the CCD solid-state image sensor 1 of this embodiment so that the reflection of oblique light constituents contained in the light R for input to the sensor 6 are suppressed from reflecting from the light-impervious film 10 and virtually all of the oblique light constituents contained in the light R can be input into the aperture 13 formed by the enclosure comprising the lower overhang 81, the side surface 8b of the first light-impervious film 8, the side surface 9a of the second light-impervious film 9, and the upper overhang 91 so that the same effect as yielded by the CCD solid-state image sensor 1 can be obtained. Additionally, the light R input inside the aperture 13 is reflected at the first light-impervious film 8, second light-impervious film 9 and light-receiving surface 6a, and even if this light R shifts toward the outer side of the aperture 13, this light R will reflect at the overhang 91 of the second light-impervious film 9 and ultimately has a high probability of entering the light-receiving surface 6a so that the light focusing rate of oblique light constituents on the sensor 6 is greatly increased. Another benefit is that the generation of smear can also be suppressed by means of the lower overhang 81 so that satisfactory optical characteristics are continually maintained and an effect of the invention allowing a smaller pixel size can be obtained.

Also as related above, the upper overhang 91 is formed in a state facing from the center of the imaging zone 21a to the periphery at a position offset from the second aperture 12 so that the focus position P formed by means of this enclosed state is aligned at the center of the second aperture 12. Since the offset (or compensation) for the input position of the light R is performed according to the pupil distance s, the oblique light constituents of the light R at the periphery of the imaging zone 21a can be focused with good efficiency, even when the pupil distance s of the camera lens system 40 is short. Accordingly, a large improvement in sensitivity can be obtained for the periphery of the imaging zone 21a, along with an overall improvement in the degree of sensitivity of the imaging zone 21a and a reduction in shooting.

Further, a large improvement in sensitivity can be obtained for the periphery of the imaging zone 21a can be obtained by adjusting the forming position of the second aperture 12 of the second light-impervious film 9, even without performing compensation (offset) by shifting the on-chip lens position a slight amount at a time from the center of the imaging zone towards the periphery according to the pupil distance s, as in the conventional art. Consequently, when forming the second aperture 12 of the second light-impervious film 9, performing position alignment in proximity to the substrate 2 can be used rather than alignment by lithography in order to form the on-chip lens 16. As a result, the precision of the alignment can be improved and the second aperture 12 formed with even greater precision at the specified position so that the offset (compensation) of the input position for light onto the sensor 6 according to the pupil distance s can be performed with good accuracy.

Since a focus point P has been provided at the position of the second aperture 12, for instance if the height position of the on-chip lens has a position the same as in the conventional art, then the on-chip lens 16 has a short distance to the focus point P. Therefore, the distance for shifting the second aperture 12 according to the pupil distance s can be kept small so that when forming the CCD solid-state image sensor 21, the positions of the second aperture 12 and the CCD solid-state image sensor 21 can be aligned with good precision and thus an effect can be obtained whereby the compensation or offset of the input light position onto the sensor 6 can be performed with good precision.

In the description of the imaging device 20 of this embodiment, the adjusting only of the second aperture 12 forming position according to the distance s was described however besides the second aperture 12 forming position, the on-chip lens 16 forming position can be of course adjusted and the offset (compensation) of the input position for the light R then performed. In such a case, the on-chip lens 16 forming position is adjusted so that the focus position P is at the center of the second aperture 12. Also when adjusting the forming position of the on-chip lens 16 along with the forming position of the second aperture 12, the on-chip lens 16 and the second aperture 12 can each be adjusted separately so that the two-dimensional design (horizontally (H), vertically (V)) on the substrate 2 can be performed individually, Therefore, along with improving the sensitivity for the two-dimensional flat surface such as at the periphery and center of the imaging zone 21a, shooting can also easily be reduced, and the effect of higher freedom of design obtained.

Figure 3:
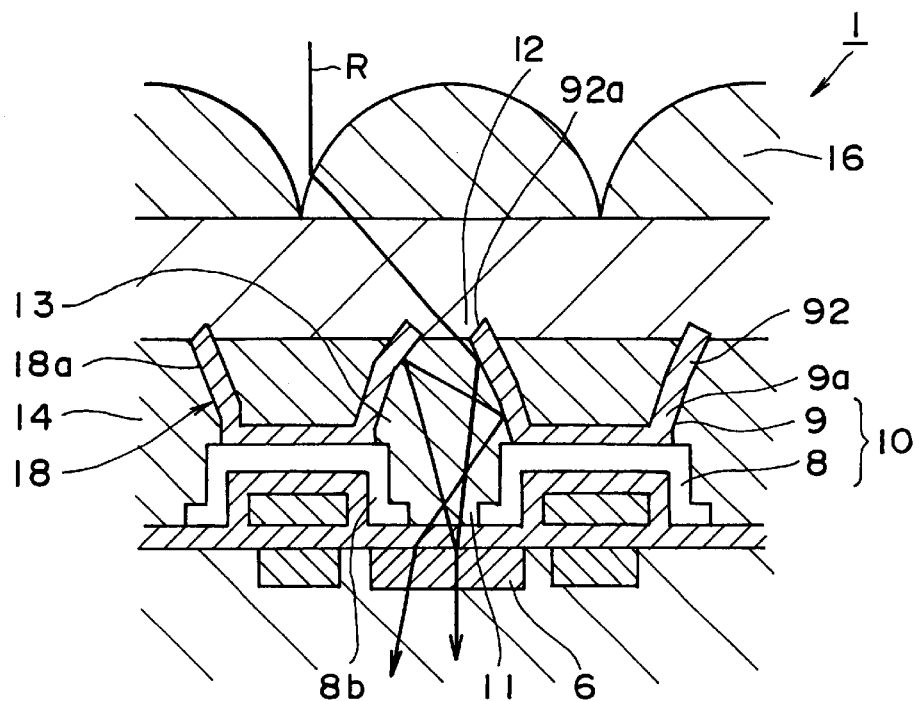
FIG. 3 is a cross sectional view showing an essential portion of the first embodiment of the invention.
Figure 4:
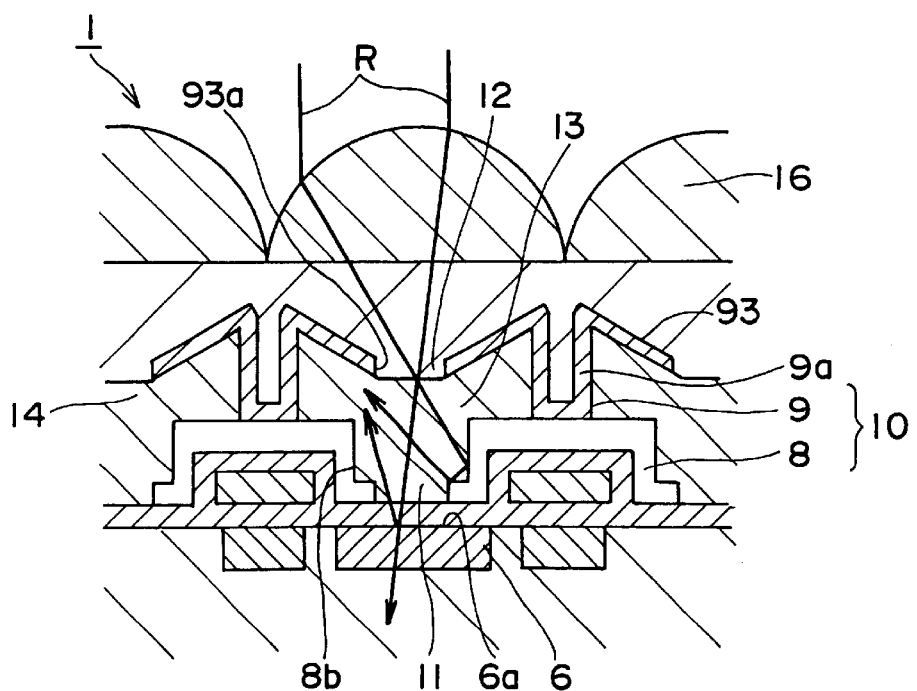
FIG. 4 is a cross sectional view showing an essential portion of the second embodiment of the invention.

Also in the imaging device 20 of this embodiment, an example was related utilizing a CCD solid-state image sensor 1 with the same cross sectional structure shown in FIG. 1, as the CCD solid-state image sensor 21, however this invention is not limited to this example. The light-impervious film for instance may be made from one film and not from a first light-impervious film and a second light-impervious film; and a solid-state image sensor having overhangs at respectively the top and bottom of the side surfaces forming the aperture at the position directly above the sensor, may also be used. A solid-state image sensor utilizing the cross sectional structures as shown in FIG. 3 and FIG. 4 may also be used.

In the solid-state imaging sensor of this invention as described above, since the lens is formed so that the focus point is at a position with a height equivalent to the edge of the upper overhang of the light-impervious film and also at a position having the aperture of the light-impervious film formed directly above the sensor, virtually all of the oblique light constituents of the input light can enter inside the aperture formed in the side surface of the light-impervious film. Further, since an overhang is formed at the top of the side surface of the light-impervious film, the light focusing efficiency of light components reflected at the light-receive surface can be increased from among the oblique light constituents input into the aperture of the light-impervious film and the light input onto the light-receive surface of the sensor. The above factors improve the sensitivity so that satisfactory optical characteristics for this invention can be maintained and the pixel size can be reduced.

In the manufacturing method for the solid-state imaging sensor of this invention, an aperture is formed directly above the sensor position by etching the material film having light-blocking characteristics and formed to cover the inner surface of the contact hole so that a solid-state imaging sensor of this invention can be manufactured provided with an upper overhang forming the (leading) edge of the edge piece constituted by this aperture. Also, since the aperture of the second light-impervious film is formed by means of etching in a state enclosed by the edges of the upper overhang, the size of the aperture and the position of the aperture can be freely adjusted. As a result, the light input position onto the sensor can be easily compensated (offset) since the forming position of the aperture of the second light-impervious film can be shifted a little at a time on the two-dimensional flat surface of the substrate according to the pupil lens camera distance. Accordingly, a CCD solid-state imaging sensor with little shooting with respect to a small pupil distance from the light source can be manufactured in an extremely effective method.

In the imaging device of this invention, the cross sectional structure of each pixel for the image zone is the same as for the solid-state imaging sensor of this invention so that the same effect as the CCD solid-state imaging sensor of this invention can be obtained. Also, the overhang at the top edge of the side surface of the light-impervious film is formed in a state offset from the aperture position facing from the center of the imaging zone to the periphery so that the lens focus point will align at the center of the aperture formed by this overhang and consequently, the light focusing efficiency can be increased still more for the oblique light constituents even at the periphery of the imaging zone. A large increase in sensitivity of the periphery of the imaging zone can therefore be obtained, even with a short pupil distance for the input light to the sensor so that the overall sensitivity of the imaging zone is improved and shooting is reduced. Also, since the light input position can be compensated (offset) according to the pupil distance by forming the aperture of the light-impervious film near the substrate, the lens position need not be shifted as is the case in the conventional art therefore alignment accuracy can be improved when forming the aperture compared to the forming of the on-chip lens in the conventional art. Accordingly, the aperture can be accurately formed at the desired position and the light input position can be compensated (offset) with good accuracy so that an improvement in the overall sensitivity of the imaging zone and a reduction in shooting can definitely be obtained.

While a preferred embodiment has been described, variations thereof will be apparent to those skilled in the art within the scope of the present inventive concepts which are delineated by the following claims.

What is claimed is:

1. A solid-state imaging sensor comprised of a line-shaped transfer electrodes arrayed at spaced intervals on a substrate, discrete sensors formed between the lines of said transfer electrodes on said substrate for performing photoelectric conversion, a light-impervious film formed with an aperture directly above each of said sensors on said substrate and also formed to cover said transfer electrodes and block the input of light into other than said sensors, and lenses formed above said light-impervious film to converge the input light onto said sensors wherein, said light-impervious film has overhangs facing towards the approximate center of said sensor from a side surface position, at respectively the top and bottom edges of said side surface position, with an aperture directly above said sensor, and said lens has a focus point at a position matching the aperture of said light-impervious film directly above said sensor and at a position with a height equivalent to the tip of said overhang installed at said top edge.

2. A solid-state imaging sensor of claim 1, having a said light-impervious film comprised of a first light-impervious film formed on said substrate and covering said transfer electrodes, and a second light-impervious film bordering the upper surface of said first light-impervious film or formed in a state in proximity to the upper surface of said first light-impervious film, said first light-impervious film is formed with a lower overhang facing towards the approximate center of said sensor from said side surface position, at the bottom edge of said side surface with an aperture directly above said sensor, said second light-impervious film is installed with an upper overhang facing towards the approximate center of said sensor from said side surface position, at the top edge of said side surface with an aperture directly above said sensor.

3. A solid-state imaging sensor of claim 2, wherein the dimensions between the mutually opposing edges of said upper overhang enclosing the aperture of the second light-impervious film, are smaller than the dimensions between the opposing edges of the side surface of said first light-impervious film enclosing the aperture of said first light-impervious film, at a position below the edge of the upper overhang.

4. A solid-state imaging sensor of claim 1, wherein the dimension between the opposing edges enclosing a position forming an aperture at the overhang installed at the top edge of the side surface are smaller than the dimensions between the opposing edges enclosing the position forming the aperture of said light-impervious film below the edge of the overhang formed at said top edge.

5. A solid-state imaging sensor of claim 2, wherein the dimensions between the mutually opposing edges of said upper overhang enclosing the aperture of the second light-impervious film, are smaller than the dimensions between the opposing edges of the lower overhang of said first light-impervious film enclosing the aperture of said first light-impervious film, at a position below the edge of the upper overhang.

6. An imaging device containing a solid-state imaging sensor having an imaging zone arrayed with pixels horizontally and vertically on a substrate wherein, said imaging zone is provided with line-shaped transfer electrodes arrayed between pixel rows facing vertically on said substrate, discrete sensors formed between the lines of said transfer electrodes on said substrate for performing photoelectric conversion, a light-impervious film formed with an aperture directly above each of said sensors on said substrate and also formed to cover said transfer electrodes and block the input of light into other than said sensors, and lenses formed to focus the input light onto said sensors formed for each pixel above said light-impervious film, said light-impervious film is provided with overhangs projecting from the side surface towards the center of said sensor, at respectively the top and bottom of the side surface with an aperture at a position directly above said sensor, said lens is formed so that the focus point is at a position with a height equivalent to the edge of the overhang at the top of the side surface of the light-impervious film at a point having the aperture of the light-impervious film formed directly above the sensor, said overhang at the top of the side surface of said light-impervious film is formed with said aperture position shifted facing from the center of the imaging zone towards the periphery so that said focus point position is at the center of the aperture formed by being enclosed by said overhang.

7. An imaging device of claim 6 having a camera lens system above said lens, said overhang at the top of the side surface of said light-impervious film is formed with said aperture position shifted facing from the center of the imaging zone towards the periphery so that said focus point position is at the center of the aperture formed by being enclosed by said overhang.

\* \* \* \* \*